(12) United States Patent
Van Der Feltz et al.

(10) Patent No.: US 7,561,251 B2
(45) Date of Patent: Jul. 14, 2009

(54) LITHOGRAPHIC APPARATUS AND DEVICE MANUFACTURING METHOD

(75) Inventors: Gustaaf Willem Van Der Feltz, 's-Hertogenbosch (NL); Cheng-Qun Gui, Best (NL); Johan Christiaan Gerard Hoefnagels, Hooge Mierde (NL)

(73) Assignee: ASML Netherlands B.V., Veldhoven (NL)

( * ) Notice: Subject to any disclaimer, the term of this patent is extended or adjusted under 35 U.S.C. 154(b) by 123 days.

(21) Appl. No.: 10/811,070

(22) Filed: Mar. 29, 2004

(65) Prior Publication Data
US 2005/0213067 A1    Sep. 29, 2005

(51) Int. Cl.
G03B 27/54    (2006.01)
G03B 27/42    (2006.01)
G03B 27/52    (2006.01)

(52) U.S. Cl. .............................. 355/67; 355/53; 355/30

(58) Field of Classification Search .................... 355/67, 355/53, 72, 75, 55, 30; 356/399, 400, 401; 250/492.2; 430/22, 30
See application file for complete search history.

(56) References Cited

U.S. PATENT DOCUMENTS

| | | | |
|---|---|---|---|
| 4,668,077 A | 5/1987 | Tanaka | |
| 5,117,255 A * | 5/1992 | Shiraishi et al. | 355/53 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,581,324 A | 12/1996 | Miyai et al. | |
| 5,677,703 A | 10/1997 | Bhuva et al. | |
| 5,808,797 A | 9/1998 | Bloom et al. | |
| 5,834,785 A | 11/1998 | Coon et al. | |
| 5,912,096 A * | 6/1999 | Hada | 430/30 |
| 5,953,106 A | 9/1999 | Unno et al. | |
| 5,982,553 A | 11/1999 | Bloom et al. | |
| 6,061,119 A * | 5/2000 | Ota | 355/53 |

(Continued)

FOREIGN PATENT DOCUMENTS

EP    1 482 375 A2    12/2004

(Continued)

OTHER PUBLICATIONS

European Search Report for European Application No. 05251565.7 mailed on Jul. 25, 2005.

(Continued)

*Primary Examiner*—Peter B Kim
(74) *Attorney, Agent, or Firm*—Sterne, Kessler, Goldstein & Fox P.L.L.C.

(57) ABSTRACT

A lithographic apparatus and method in which a patterning system is used to impart to a projection beam a pattern in its cross-section. The beam is directed by a projection system from an illumination system onto a target portion of the surface of a substrate supported on a substrate support. The target portion has predetermined spatial characteristics relative to the substrate table that are appropriate for a desired exposure pattern on the surface of the substrate. The temperature of the substrate is measured, and the dimensional response of the substrate to the measured temperature is calculated. The spatial characteristics of the target portion relative to the substrate table are adjusted to compensate for the calculated dimensional response.

18 Claims, 5 Drawing Sheets

U.S. PATENT DOCUMENTS

| | | | |
|---|---|---|---|
| 6,088,080 A * | 7/2000 | Itoh | 355/30 |
| 6,133,986 A | 10/2000 | Johnson | |
| 6,177,980 B1 | 1/2001 | Johnson | |
| 6,377,334 B2 * | 4/2002 | Whiting | 355/55 |
| 6,416,913 B1 | 7/2002 | Suzuki | |
| 6,424,879 B1 | 7/2002 | Chilese et al. | |
| 6,654,660 B1 | 11/2003 | Singh et al. | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,909,588 B2 | 6/2005 | Moffatt | |
| 7,151,588 B2 | 12/2006 | Franken et al. | |
| 2002/0146628 A1 * | 10/2002 | Ota | 430/22 |
| 2004/0012404 A1 * | 1/2004 | Feder et al. | 324/760 |
| 2004/0041104 A1 | 3/2004 | Liebregts et al. | |
| 2004/0084633 A1 * | 5/2004 | Moffatt | 250/492.2 |
| 2004/0130561 A1 | 7/2004 | Jain | |
| 2005/0007572 A1 | 1/2005 | George et al. | |
| 2007/0008531 A1 | 1/2007 | Smeets | |
| 2007/0026325 A1 | 2/2007 | Maria et al. | |
| 2007/0075315 A1 | 4/2007 | Venema et al. | |
| 2007/0076180 A1 | 4/2007 | Tinnemans et al. | |
| 2007/0257209 A1 | 11/2007 | Ottens et al. | |

FOREIGN PATENT DOCUMENTS

| | | |
|---|---|---|
| EP | 1 513 021 | 10/2007 |
| GB | 2321316 | 7/1998 |
| JP | 10326732 | 12/1998 |
| WO | WO 97/14077 | 4/1997 |
| WO | WO 98/33096 A1 | 7/1998 |
| WO | WO 98/38597 A2 A3 | 9/1998 |
| WO | WO 00/72090 A2 | 11/2000 |

OTHER PUBLICATIONS

English Abstract of Japanese Patent No. 10326732, 1 page, data supplied from the esp@cenet database.

Office Action for Korean Application No. 10-2007-0048873 mailed Aug. 20, 2007, 8 pgs.

Translation of Office Action for Korean Applicaion No. 10-2006-0097120 completed on Nov. 14, 2007, 5 pgs.

* cited by examiner

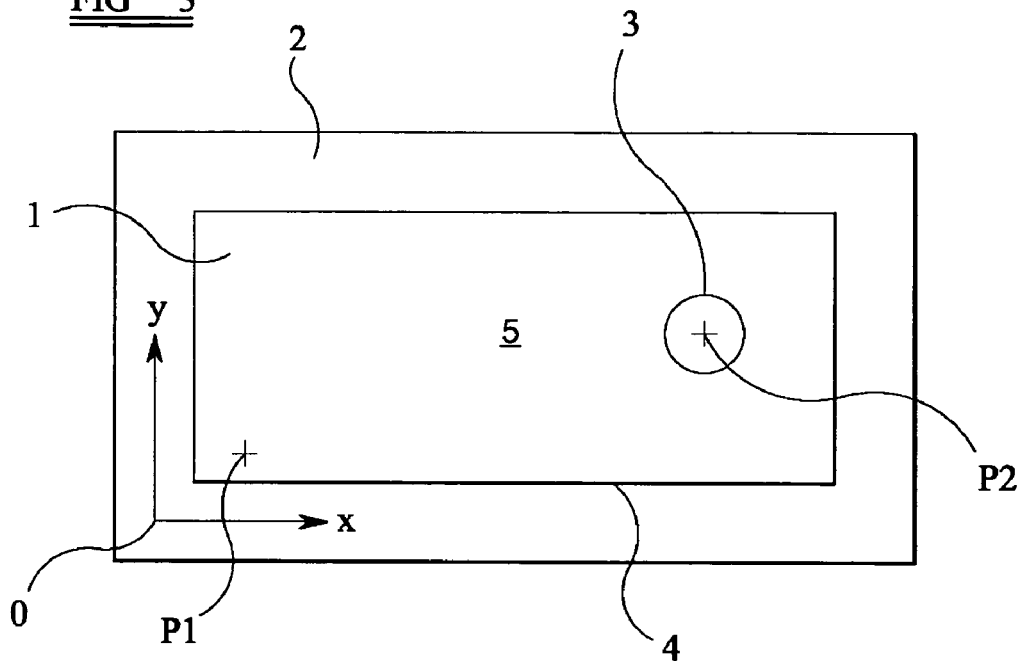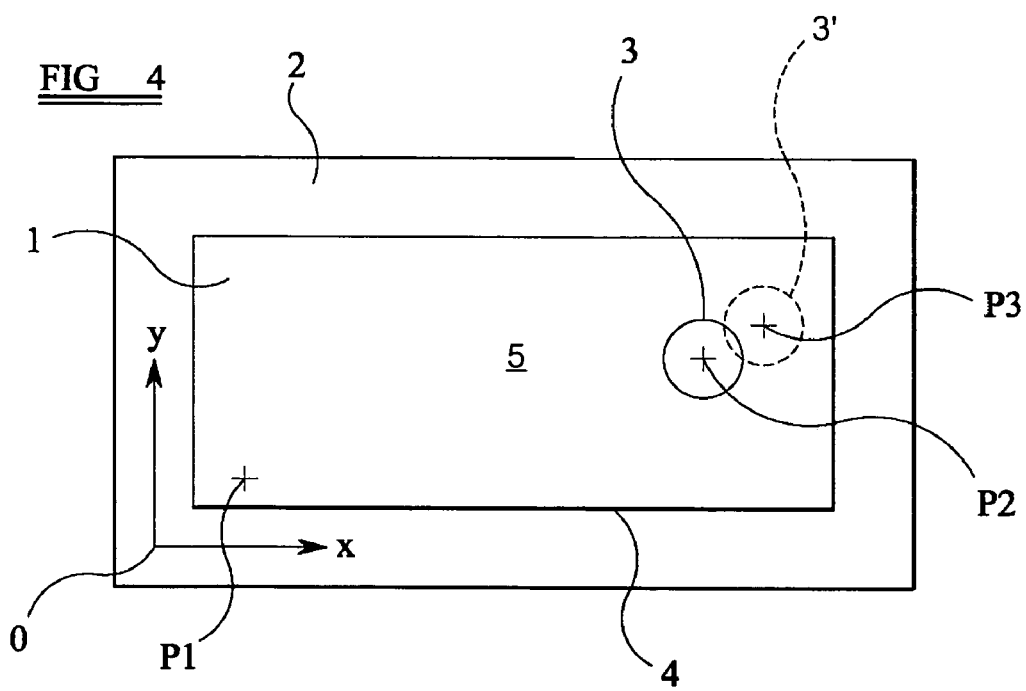

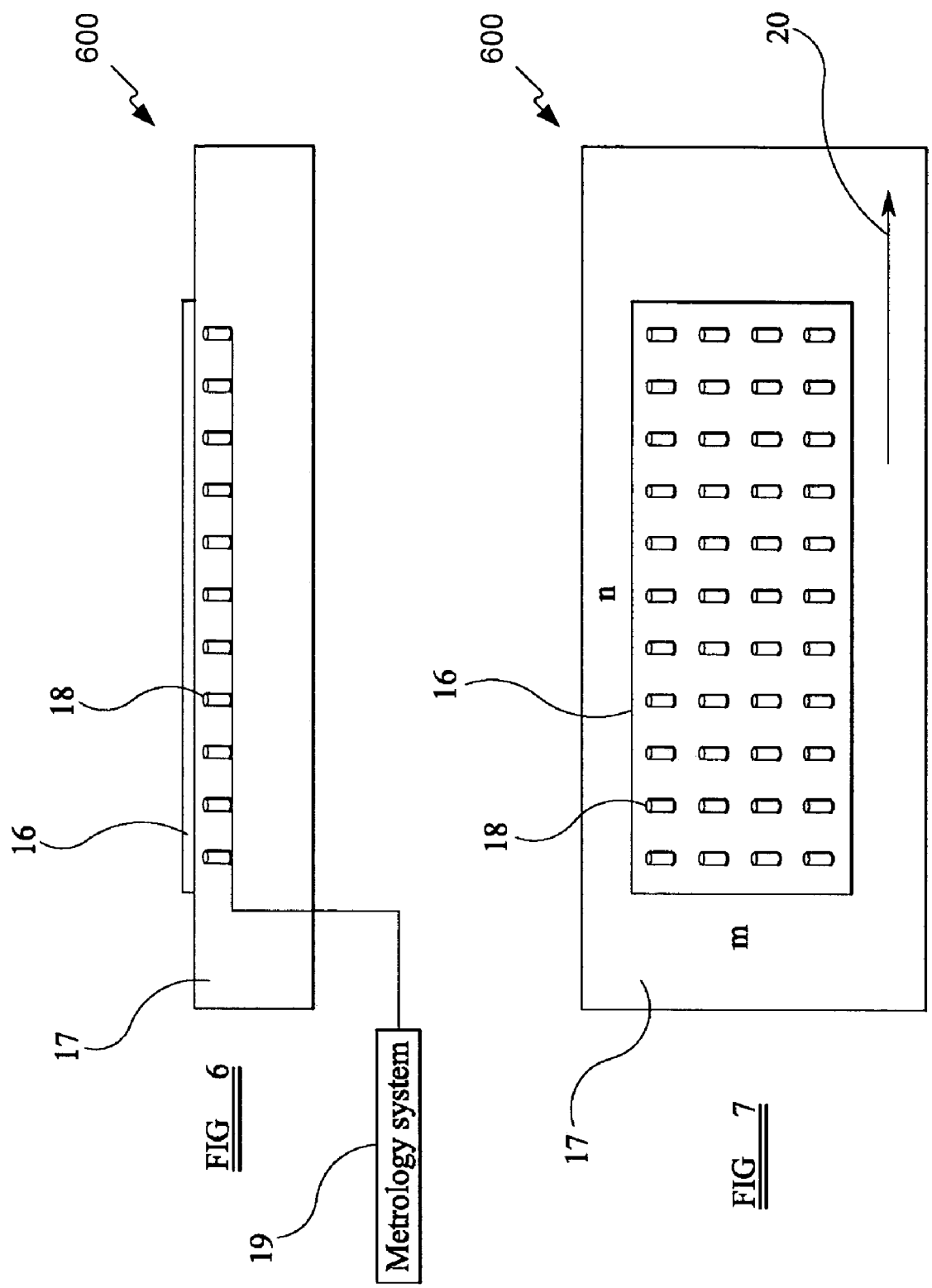

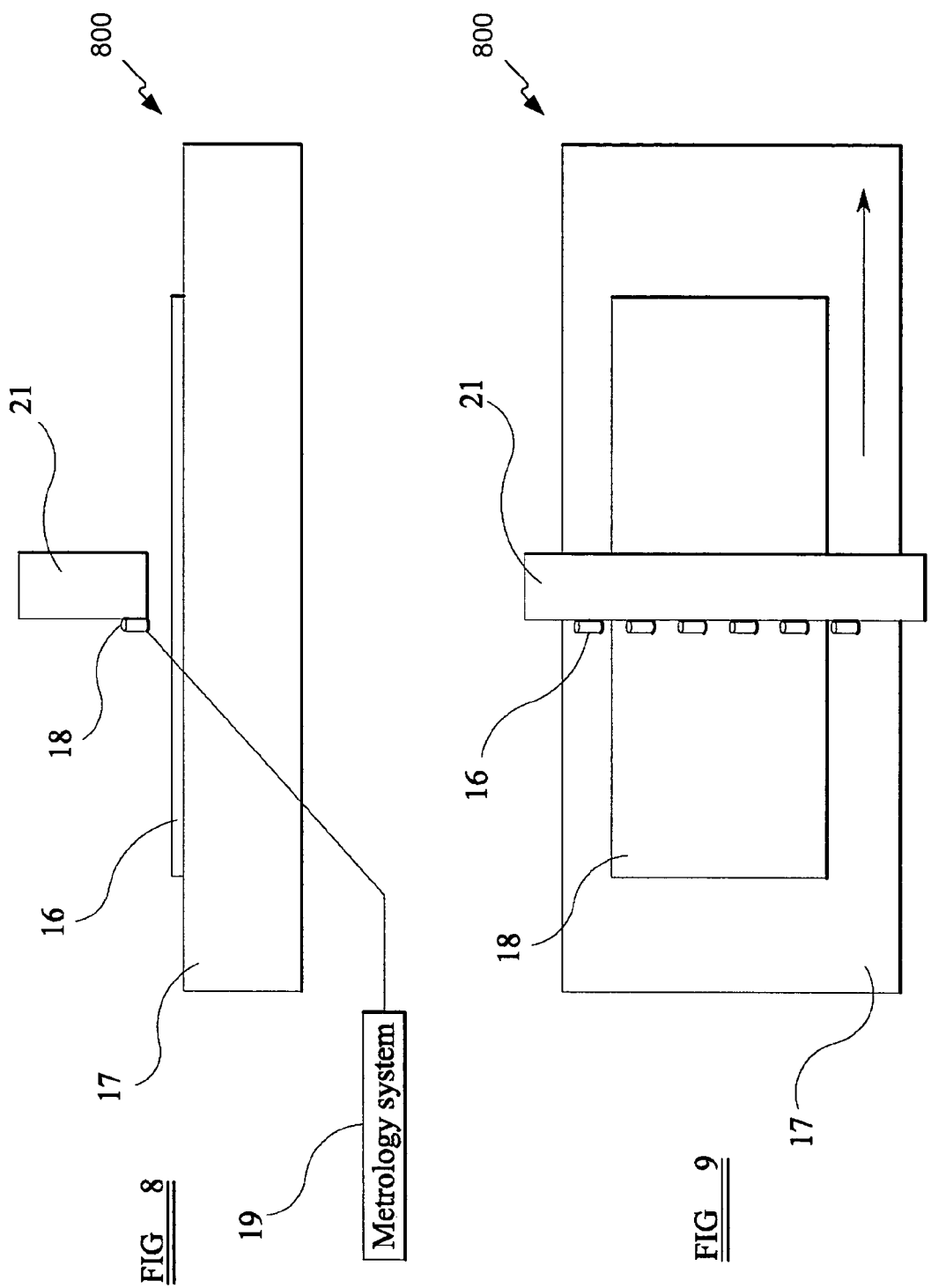

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., part of one or several dies) on a substrate (e.g., a silicon wafer or glass plate) that has a layer of radiation-sensitive material (e.g., resist). Instead of a mask, the patterning means may include an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning"-direction), while synchronously scanning the substrate parallel or anti-parallel to this direction.

It will be appreciated that, whether or not a lithographic apparatus operates in stepping or scanning mode, it is vital that the patterned beam is directed onto the appropriate target portion of the substrate surface. In many circumstances multilayer structures are built up on the surface of the substrate as a result of a sequence of lithographic processing steps and it is of course vital that the successive layers formed in the substrate are correctly in register with each other. Thus, great care is taken to ensure that the position of the substrate relative to the beam projection system is accurately known. Generally, this is achieved by positioning the substrate in a known orientation on a substrate table, for example by engaging an edge of the substrate with a support surface on the substrate table and then using a reference mark on the substrate to identify exactly where the substrate is relative to the substrate table. A metrology system is then used to control relative displacement between the substrate and the beam projection system. The reference mark establishes a datum position relative to which all displacements are measured.

As the size of substrates has increased it has become more difficult to rely upon a single reference mark on a substrate to determine exactly where the substrate is relative to a datum position. To address this problem it has been known to put multiple reference marks on a single substrate, so that the metrology system which monitors substrate position can be recalibrated after a relatively small displacement as between the projection system and the substrate. However, in some applications this is not possible, for example in the manufacture of large flat panel displays (FPD's) relying upon large numbers of liquid crystal devices (LCD's) as a pattern generator system. In the case of FPD's, very large thin glass substrates are contemplated (e.g., about 1.85×2.2 meters) with a thickness of less than about 1 mm. On each glass substrate, several panels (e.g., 4, 6 or 9) may be defined, each panel corresponding to a single product (e.g., a computer monitor screen, a television screen, or the like) with sizes ranging currently from about 10 inches to about 55 inches (measured diagonally from corner to corner). Within each panel area on a single substrate, individual LCD's each defining individual pixels are arrayed. To ensure high optical transmission efficiency and to avoid irregular visually apparent optical effects, no alignment features can be formed within any one panel. Thus, alignment features must be arranged around the periphery of the glass substrate and between adjacent panels. As the size of individual panels increases, the distance between adjacent alignment features also increases. Thus, less alignment information can be acquired from alignment features formed on the surface of the substrate.

One source of positional errors as between the projection system and the substrate is thermal expansion. If two marks are made on the surface of the substrate, and the temperature of the substrate is then increased, the spacing between those marks will increase as the result of thermal expansion. Therefore, a structure formed on the surface of a substrate when the substrate is at one temperature will not register with a subsequently formed structure if the subsequently formed structure is the result of a later exposure when the temperature of the substrate has changed. This is a well known problem that has been addressed in the past by taking great care to maintain substrates at a predetermined datum temperature. However, in practice this is difficult to achieve, particularly with large substrates. It is now possible to contemplate substrates of very large size, for example substrates having outside dimensions of the order of two meters. Very small temperature variations across substrates of such size can result in expansions and contractions which are significant in the context of for example LCD display panels.

Therefore, what is needed is a system and method that allow for accurate alignment between exposures, while substantially eliminating or reducing misalignment caused by thermal expansion.

SUMMARY OF THE INVENTION

An embodiment of the present invention provides a lithographic apparatus including an illumination system that supplies a projection beam of radiation, a patterning system serving to impart to the projection beam a pattern in its cross-section, a substrate table that supports a substrate, and a projection system that projects the patterned beam onto a target portion of the surface of the substrate. The target portion has predetermined spatial characteristics relative to the substrate table that are appropriate for a desired exposure pattern on the surface of a substrate supported in a predetermined position on the substrate table. The apparatus can further include a measuring system that measures a temperature of the substrate, a system that calculates a dimensional response of the substrate to the measured temperature, and a system for adjusting the spatial characteristics of the target portion relative to the substrate table to compensate for the calculated dimensional response.

The temperature measuring system may include at least one sensor for measuring the temperature of the substrate at each of a plurality of regions distributed across the substrate surface. For example, a plurality of sensors may be distributed across a substrate table, each sensor either sensing the temperature of an adjacent region of the substrate supported on the substrate table or sensing the temperature of an adjacent region of the substrate table on the assumption that the temperature of adjacent regions of the substrate and substrate table will be the same or similar. As an alternative, a plurality of sensors may be distributed on a support positioned above the substrate table, and a scanning system may be arranged to displace the substrate table relative to the sensors and to measure the temperature of the regions of the substrate adjacent to each sensor at each of a plurality of relative positions between the substrate table and the sensor support.

Another embodiment of the present invention provides a device manufacturing method including the steps of providing a substrate, providing a projection beam of radiation using an illumination system, imparting to the projection system a pattern in its cross section, supporting the substrate on a substrate table, and projecting the patterned beam of radiation onto a target portion of a surface of the substrate. The target portion has spatial characteristics relative to the substrate table that are appropriate to a desired exposure patterned on the surface of a substrate supported in the predetermined position on the substrate table. The method further includes the steps of measuring a temperature of the substrate, calculating the dimensional response of the substrate to the measured temperature, and adjusting the spatial characteristics of the target portion relative to the substrate table to compensate for the calculated dimensional response.

A further embodiment of the present invention provides a method for establishing a model of a dimensional response of a substrate to changes in temperature including the following steps. A plurality of alignment features are formed on a surface of the substrate. The alignment features are distributed across the surface of the substrate, such that their spatial distribution is predetermined assuming a predetermined substrate temperature. The temperature of the substrate is measured. The spatial distribution of the alignment features is measured at the measured substrate temperature. A model of the dimensional response is derived from differences between the predetermined spatial distribution and the measured spatial distribution.

One or more embodiments of the present invention can be used in a lithographic apparatus relying various types of pattern generators. For example, pattern generators using arrays of individually controllable elements to impart a pattern to the projected beam and pattern generators using simple reticles (e.g., masks) to impart a desired pattern.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 3 schematically represents a desired exposure pattern on a substrate according to an embodiment of the present invention.

FIG. 4 schematically represents how the desired exposure pattern of FIG. 3 must be modified if the substrate temperature is increased.

Figure 5:
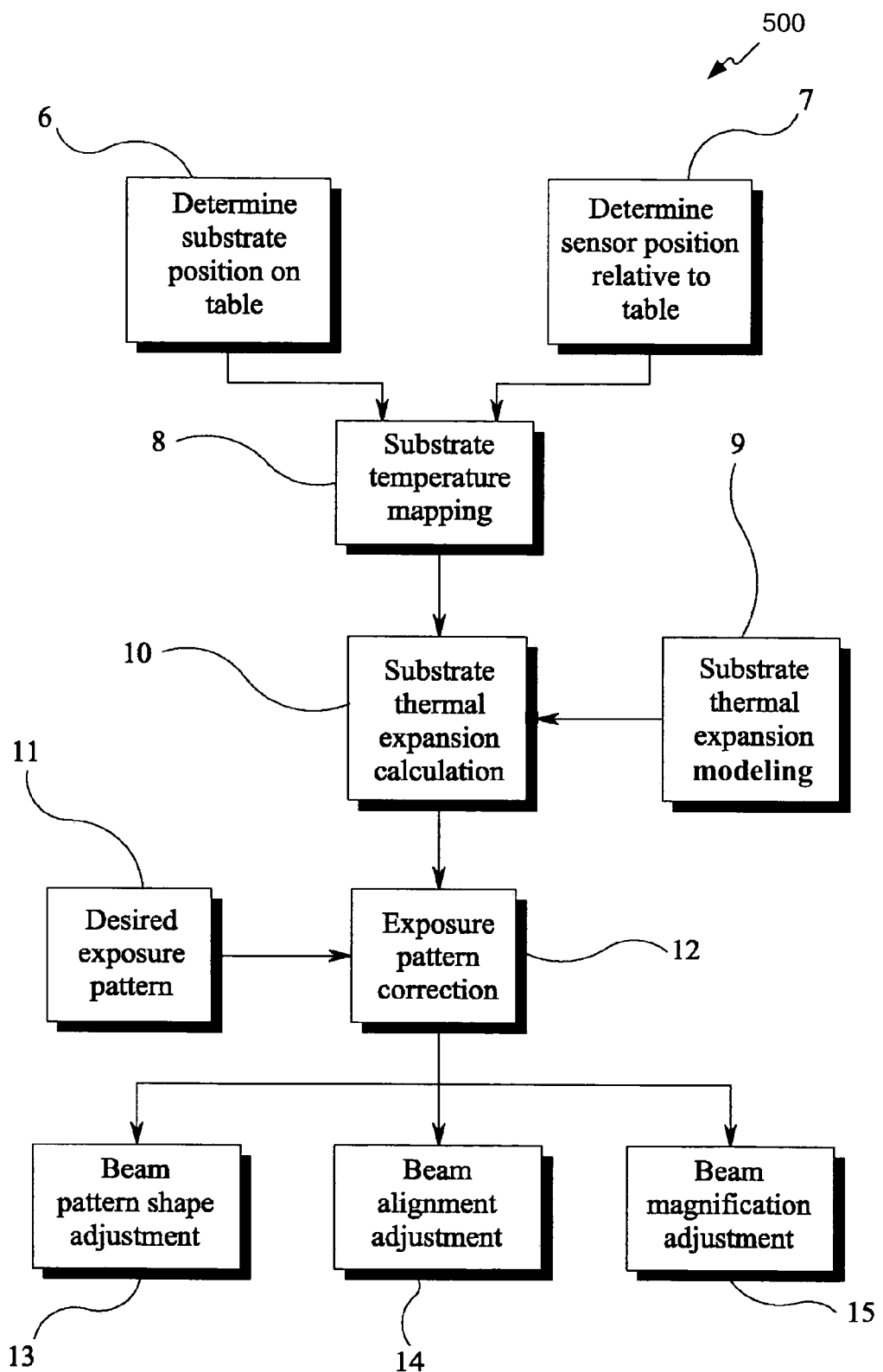

FIG. 5 is a schematic block diagram illustrating a system according to an embodiment of the present invention for adjusting an exposure pattern to compensate for changes in substrate temperature.

FIG. 6 is a schematic side view of a first sensor array, which is embedded in a substrate support table to enable the temperature of a substrate mounted on the table to be measured according to an embodiment of the present invention.

FIG. 7 is a schematic top view of the array of FIG. 6.

FIG. 8 is a schematic side view of a second sensor array, which is mounted above a substrate support table to enable the temperature of a substrate mounted on the table to be measured according to an embodiment of the present invention.

FIG. 9 is a schematic top view of the array of FIG. 8.

The present invention will now be described with reference to the accompanying drawings. In the drawings, like reference numbers may indicate identical or functionally similar elements.

DETAILED DESCRIPTION OF THE INVENTION

Overview and Terminology

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described hereabove, the array of individually controllable elements can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
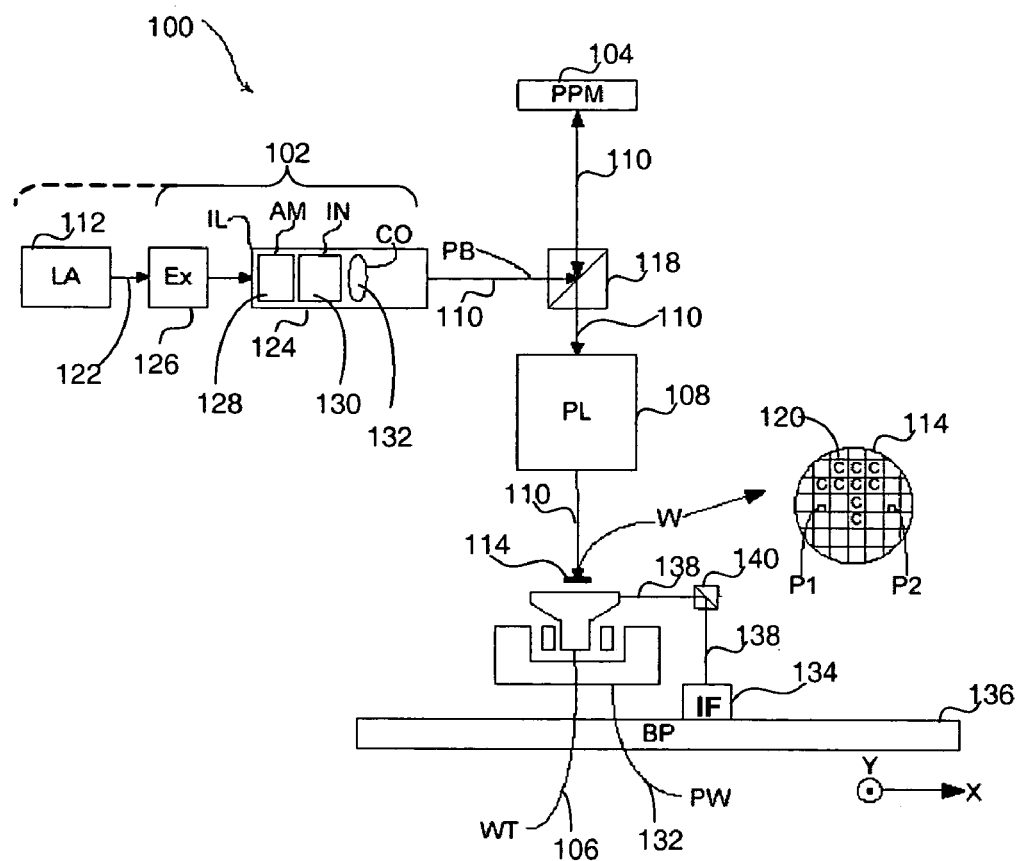
FIG. 1 depicts a lithographic apparatus according to an embodiment of the present invention.

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 104 (e.g., a programmable mirror array) can be used for applying a pattern to the projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or CaF2 lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 104 onto the substrate 114. Alternatively, the projection system 108 may project images of secondary sources for which the elements of the array of individually controllable elements 104 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 104 has a desired uniformity and intensity distribution in its cross section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 104 after being directing using beam splitter 118. Having been reflected by the array of individually controllable elements 104 the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 104 can be used to accurately correct the position of the array of individually controllable elements 104 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that the projection beam 110 may alternatively/additionally be moveable while the object table 106 and/or the array of individually controllable elements 104 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. The substrate table 106 is then moved in the x and/or y directions to a different position for a different target portion 120 to be irradiated by the beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that the projection beam 110 is caused to scan over the array of individually controllable elements 104. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 104 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 104 is updated as the projection beam 110 scans across the substrate 114 and exposes it.

Combinations and/or variations on the above described modes of use or entirely different modes of use may also be employed.

Exemplary Imaging Arrangements

Figure 2:
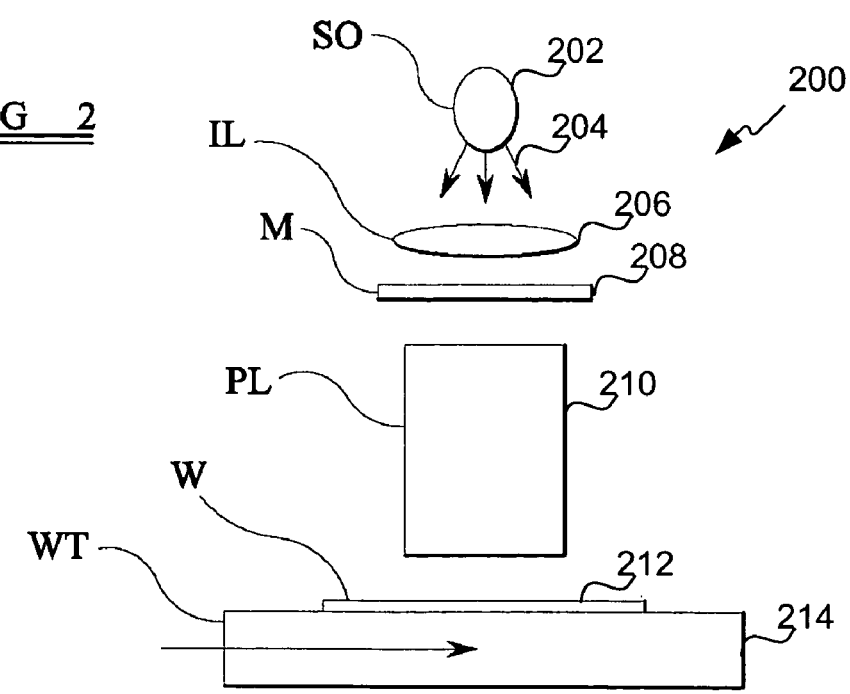
FIG. 2 depicts a lithographic apparatus according to an embodiment of the present invention.

FIG. 2 schematically depicts a lithographic projection apparatus 200 according to an embodiment of the present invention. Apparatus 200 includes a light source 202 (SO) that generate a radiation beam 204 received at an illuminator 206 (IL). Illuminator 206 delivers a radiation beam to a transmissive pattern generator 208 (M) (e.g., a mask, a reticle, spatial light modulator, or the like). A patterned beam is thus transmitted from transmissive pattern generator 208 to a projection system 210 (PL) and then to the surface of a substrate 212 (W) supported on a substrate table 214 (WT), which is displaceable beneath the projection system 210.

Although both the embodiments in FIGS. 1 and 2 are discussed below, only the reference numbers for FIG. 1 will be used for ease of discussion, unless otherwise noted.

In the embodiments of FIG. 1 and FIG. 2, the patterned beam has imparted on it a pattern in its cross section that is appropriate to a desired exposure pattern on the surface of the substrate 114. That beam has spatial characteristics, for example position and size, in an XY coordinate system defined with reference to the substrate table 106 upon which the substrate 114 is positioned. The substrate 114 is located in a predetermined position on the substrate table 106 and the patterned beam is projected onto the substrate 114 on the basis that the substrate 114 is indeed in the appropriate predetermined position. If the substrate 114 is not in the appropriate predetermined position the target portion will of course not be correctly positioned on the substrate 114. Accordingly, it is vital that the substrate 114 is appropriately positioned on the substrate table 106 using various techniques known to one of ordinary skill in the art to ensure appropriate positioning of substrates on substrate tables.

Exemplary Effects on Target Position Due to Thermal Expansion

FIG. 3 shows a substrate 1 mounted on a substrate table 2 according to an embodiment of the present invention. A coordinate system corresponding to substrate table 2 has an origin 0 and axes x,y. Assuming that it is desired to expose a target portion 3 (e.g., a region having a predetermined diameter and position relative to the substrate 1) on substrate surface 5, it is necessary to appropriately pattern the radiation beam and position the patterned radiation beam relative to the substrate 1, so that the correct portion of the substrate 1 is exposed. This requires that the substrate 1 is in a predetermined position relative to the substrate table 2.

In one embodiment, the positioning is done using a reference mark at point P1 (indicated by a cross) provided on surface 5 of substrate 1 and an edge, for example edge 4, that may be aligned in the X direction by clamping substrate 1 against appropriate abutments on substrate table 2. Given knowledge of the dimensions of the substrate 1, every point on the substrate 1 can then be referenced in the x, y coordinate system of the substrate table 2 relative to the reference point P1. For example, the target portion 3, which is to be exposed, can be defined by reference to a point P2 defining its center and a radius drawn from point P2.

If the target portion 3 is to be correctly positioned on the substrate 1, for example relative to surface structures in the substrate 1 that are a result of previous exposure steps, it is essential that the dimensions of the substrate 1 are known. This information can be used so that the position of the target portion 3 can be appropriately determined. However, as discussed above, substrate 1 can be subject to thermal expansion, which required great efforts in conventional systems to ensure that the substrate 1 is always at a predetermined datum temperature, for example 20° C. For example, FIG. 4 illustrates what will happen if the substrate 1 is at a temperature above the predetermined datum temperature.

Referring to FIG. 4, the target portion 3 is shown at the position measured in the X, Y coordinate system of the substrate table 2 relative to the reference point P1. However, if the substrate 1 expands target portion 3 may move a distance further away from the reference point P1, for example to the region 3' which is centered on the point P3 as defined in the substrate table coordinate system. Although this effect is grossly exaggerated in FIG. 4, it will be appreciated that as the critical dimensions of required substrate features reduce and substrate sizes increase, real problems can arise which lead to serious pattern misalignment even if only minor temperature variations of the order of fractions of degrees occur. This misalignment caused by thermal expansion can be substantially reduced or eliminated through the techniques discussed in reference to FIGS. 5-9.

Exemplary Method to Compensate for Thermal Expansion

Although both the embodiments in FIGS. 1 and 2 are discussed below, only the reference numbers for FIG. 1 will be used for ease of discussion, unless otherwise noted.

FIG. 5 schematically represents a measurement and adjustment method 500 in accordance with an embodiment the present invention. In this embodiment, an accurate measurement of the temperature of the substrate 114 is used to adjust the system 100 to take account of sensed temperature variations. It is to be appreciated that every effort will still be made to maintain a stable and predetermined datum substrate temperature, but the system according to the embodiments of the present invention described below compensate for variations from this datum temperature. In step 6, knowledge of substrate position on a substrate table is determined, for example through loading a substrate and performing pre-alignment. In step 7, sensing of temperature across the substrate is performed by (a) positioning sensors at locations that are known relative to the substrate tables and (b) determining the positions of the sensors relative to the substrate table.

Given the known geometry of the substrate and the sensor positions, a substrate temperature mapping step 8 produces a temperature map [t (x, y)] representing the temperature of the substrate at each of a matrix of regions distributed across the substrate surface. Particularly with large substrates, there may be temperature variations across both the length and width of the substrate and these variations can be represented in the temperature map.

In step 9, a model is developed of the predicted dimensional response of the substrate to changes in temperature. A resultant model can allow for predictions, for example, how the distance between two points on the substrate will change with temperature. For example, the resultant model can allow for predictions of how the distance between the center P2 of the target portion 3 and the reference point P1 in FIG. 4 will change with temperature variations.

In step 10, the dimensional response of the substrate to changes in temperature can be calculated based on the temperature map provided by step 8 and the model provided by step 9.

In step 11, a desired exposure pattern is input into the lithographic system. The desired exposure pattern can include features defined in terms of the substrate table coordinate system on the assumption that the dimensions of the substrate have not been affected as a result of thermal expansion or contraction.

In step 12, the desired exposure pattern is adjusted to take into account the calculated thermal expansion of the substrate. In one embodiment, this adjustment can be represented as follows:

$$P'(x, y) = F[P(x,y); t(x,y)]$$

where

P(x,y) is the position of a pattern feature in the coordinate system of the substrate table according to the desired exposure pattern;

P'(x,y) is the position of the same feature after adjustment to take account of thermal expansion or contraction of the substrate; and t (x,y) is the substrate temperature map.

Given the adjustment of the position relative to the substrate table coordinate system of the target portion of the substrate, it is necessary to adjust the lithographic apparatus so that the patterned beam is delivered to the appropriate target portion of the substrate. This can be achieved by adjustment to any of the characteristics of the lithographic apparatus which will result in changes in the dimensional characteristics of the target portion. In step 13, beam pattern shape can be adjusted. In step 14, beam alignment can be adjusted. In step 15, beam magnification can be adjusted. Any one or more of these three proceeding steps can be performed depending on the application of the lithography system. The beam pattern shape could be adjusted to turn for example a square shape to a trapezium shape. A beam alignment adjustment could for example simply displace a target portion in the x and y directions as appropriate. A magnification adjustment could expand for example a square shape into a larger square shape.

Exemplary Systems to Compensate for Thermal Expansion

FIGS. 6 and 7 show a side and top view, respectively, of a system 600 according to an embodiment of the present invention. System 600 can be used for measuring the temperature of a substrate. In the case illustrated in FIGS. 6 and 7, a substrate 16 is positioned on a substrate table 17 and the same substrate table 17 has embedded within it an m by n matrix (m=1, 2, 3 . . . and n=1, 2, 3, . . . ) of temperature sensors 18. The sensors 18 are connected to a metrology system 19 which controls, for example, stepping or scanning of the substrate in the direction represented in FIG. 7 by arrow 20 and also controls the patterning and positioning of the projection beam. Thus, the array of sensors 18 measures of the temperature of the substrate regions immediately adjacent the sensors 18. Using this system, positions of the sensors 18 can be known with respect to the substrate table coordinate system, Thus, in an embodiment employing method 500, the temperature map in step 8 can derived.

FIGS. 8 and 9 show a side and top view, respectively, of a system 800 according to an embodiment of the present invention. System 800 in one alternative sensor arrangement to that illustrated in FIGS. 6 and 7 contemplated within the scope of the present invention. The same reference numerals are used in FIGS. 8 and 9 as FIGS. 6 and 7 for similar elements.

In this embodiment, sensors 18 are supported on a frame 21 beneath which the substrate 16 is transported on the substrate table 17. There is an array of m temperature sensors 18 spaced apart on the frame 21. Before a substrate 16 is exposed, the substrate 16 will be moved in n steps beneath the frame 21 so that measurements may be made of the temperature of regions of the substrate 16 distributed in an m by n matrix. The result is similar data as may be derived using the arrangement described with reference to FIGS. 6 and 7, that is a temperature map of the substrate 16 that may be used to calculate the substrate thermal expansion or contraction. In one embodiment, this can be determined in step 9 of method 500, discussed above.

Exemplary Methods to Perform a Thermal Expansion Modeling Step

Referring again to FIG. 5, the substrate thermal expansion modeling step 9 will be further described according to an embodiment of the present invention. In various embodiment, the model may be derived directly from a substrate to be processed by making appropriate measurements of that substrate, or may be derived indirectly from a reference substrate whose physical characteristics are substantially the same as the substrate to be processed.

In an embodiment where the thermal expansion model is to be derived directly, this can be achieved by forming a matrix of alignment features on the substrate, concurrently measuring the temperature of the substrate and the spatial distribution of those features in a first measurement step, and then concurrently measuring the temperature of the substrate and the spatial distribution of those features in a second measurement step. The two measurement steps could be conducted on the same apparatus, for example the lithographic apparatus of FIG. 1 or 2, but could be conducted on different measurement tools as well. A model of the dimensional response of the substrate can then be derived from the differences in temperature and feature distribution as between the two measurement steps.

In another embodiment, the thermal expansion model can be derived directly from the substrate to be processed. This can be done by forming first and second sets of alignment features, measuring the temperature and spatial distribution of the first set in one measurement step, measuring the temperature and spatial distribution of the second set in a second measurement step, and deriving the model from the results of the two measurement steps. For example, a first pattern of alignment features is formed, the substrate is then coated with a resist in a lithographic apparatus, and a second pattern is exposed and developed, the second pattern having the same nominal spatial distribution as the first except for a nominal offset in the X and Y directions of $(X_0, Y_0)$. Thus, the second layer is exposed without any attempt at correction for temperature variations. A temperature map of the substrate is derived concurrently with formation of the second pattern, the term concurrently being used to indicate that the pattern formation and temperature measurement steps are conducted to the extent possible in the same period of time (e.g., simultaneously or one immediately after the other). The actual offsets between features of the two patterns are then measured, the differences between the measured offsets and the nominal offsets enabling the derivation of the required thermal expansion model.

In a further embodiment, the thermal expansion model can be derived from a reference substrate. The physical characteristics of the reference substrate can be similar as a class of substrates to be processed. Again, either the distribution of a single pattern can be measured at different temperatures or the distributions of two patterns can be compared to derive a thermal expansion model to be used for substrates of the same class. Where a second pattern is relied upon, it could be formed by exposing, but not developing, a layer of resist. After measurement of the second pattern, the resist could be washed off the reference substrate, enabling its use again in a later thermal expansion model derivation. Repeated periodic use of the single reference substrate to derive a thermal expansion map could be advantageous in enabling drift in processing conditions to be detected.

In a preferred embodiment, thermal expansion modeling can be performed using the same apparatus as that to be used in subsequent processing steps of the substrates of interest. This ensures that thermal effects resulting from for example exposure of a substrate to an illumination beam are faithfully reproduced in the modeling process. However, the modeling could be conducted using other metrology tools, provided all conditions (e.g., the thermal and mechanical characteristics of the substrate support and clamping system) could be accurately reproduced in such tools.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A device manufacturing method, comprising:
   emitting a beam of radiation using an illumination system;
   imparting to the beam a pattern in its cross section;
   projecting the patterned beam of radiation onto a target portion of a surface of a substrate;
   measuring a first respective temperature of a first plurality of regions in the target portion of the substrate;
   measuring a second respective temperature of a second plurality of regions in the target portion of the substrate;

calculating a dimensional response from differences between measurements of the first and the second respective temperatures of the first and the second plurality of regions of the substrate; and concurrently adjusting, in real time, one or more spatial characteristics of the patterned beam relative to a substrate support to compensate for the calculated dimensional response, wherein the spatial characteristics comprise a cross-sectional shape of the patterned beam, a position of the patterned beam, and a size of the patterned beam.

2. The method according to claim 1, wherein the first and the second respective temperature is measured at the first and the second plurality of regions distributed across the surface of the substrate.

3. The method according to claim 1, wherein the first and the second respective temperature is measured with a plurality of sensors distributed across the substrate support and each of the plurality of sensors sense an additional temperature of an adjacent region of the substrate.

4. The method according to claim 3, wherein:
the plurality of sensors are distributed on a sensor support located above the substrate support;
the substrate support and the plurality of sensors are displaced relative to each other; and
the additional temperature of regions of the substrate adjacent each of the plurality of sensors are measured at each of a plurality of relative positions between the substrate support and the sensor support.

5. The method according to claim 4, wherein the plurality of sensors are supported on a stationary frame located above the substrate support and the substrate support is displaced beneath the frame.

6. The method according to claim 5, wherein the substrate support is displaced in a predetermined direction and the sensors are supported in a linear array extending transverse to the said direction.

7. The method according to claim 1, further comprising:
generating a map of an overall temperature across the substrate;
developing a model of the dimensional response of the substrate in a substrate-support coordinate system;
generating a substrate position map that represents a change in position of points on the substrate relative to the substrate support coordinate system given the map of the overall temperature across the substrate and the model of the dimensional response; and
adjusting the spatial characteristics of the patterned beam in accordance with the substrate position map to compensate for the dimensional response.

8. A method, comprising:
measuring a first set of temperatures, wherein each temperature corresponds to the temperature at a first different respective regions of a substrate;
forming a first pattern of alignment features at the first different respective regions of the substrate having the measured first set of temperatures during an exposure of the substrate;
measuring a first set of spatial distributions of the first pattern of alignment features of the substrate occurring during the first set of temperatures;
measuring a second set of temperatures, wherein each temperature in the second set corresponds to a second different one of the respective regions of the substrate;
forming a second pattern of alignment features at the second different respective regions of the substrate having the measured second set of temperatures during a subsequent exposure of the substrate;
measuring a second set of spatial distributions of the alignment features occurring during the second set of temperatures; and
determining a dimensional response from differences between measurements of the first set of spatial distributions and measurements of the second set of spatial distributions.

9. The method according to claim 8, wherein:
the substrate is a reference substrate which is one of a class of substrates having similar physical characteristics and which are to be processed in a lithographic apparatus;
the spatial distribution of the alignment features of the reference substrate is measured when the reference substrate is supported on a substrate support of the lithographic apparatus;
a member of the class of substrates is subsequently placed on the substrate support;
the temperature of the substrate supported on the substrate support is measured at each of a plurality of regions distributed across a substrate surface; and
processing of the substrate is adjusted based on correlating a change in the substrate dimensions with a dimensional response model derived from the reference substrate.

10. The method of claim 9, comprising:
adjusting one or more spatial characteristics of a patterned beam used to form the first and the second patterns relative to the substrate support to compensate for the determined dimensional response, wherein the spatial characteristics comprise a cross-sectional shape of the patterned beam, a position of the patterned beam, and a size of the patterned beam.

11. The method of claim 10, wherein the adjusting comprises:
adjusting a magnification of the patterned beam.

12. The method of claim 9, wherein the measuring the first and the second set of temperatures comprises:
positioning a plurality of sensors, arranged in a linear array extending transversely relative to a direction in which the substrate support is displaceable, to measure the first and the second sets of temperatures, wherein each of the plurality of sensors sense the temperature of an adjacent region of the substrate.

13. The method according to claim 8, further comprising:
causing the first and second patterns to have a same nominal spatial distribution with a nominal offset between the two patterns; and
deriving the dimensional response model from differences between nominal and measured offsets between features of the two patterns.

14. The method according to claim 8, further comprising:
forming the first pattern on a reference substrate that is one of a class of substrates having similar physical characteristics and which are to be processed in a lithographic apparatus;
forming the second pattern on the reference substrate by exposing a layer of resist supported on the reference substrate in the lithographic apparatus;
measuring the differences between the nominal and measured offsets within the lithographic apparatus; and
washing the exposed resist off the reference substrate to enable re-use of the reference substrate.

15. The method of claim 8, further comprising:
generating a map of an overall temperature distribution across the substrate; and generating a substrate position map that represents a change in position of points on the substrate relative to a substrate support coordinate system given the map of the overall temperature across the substrate and the determined dimensional response.

16. A lithographic apparatus, comprising:

a temperature measuring system to measure a first and a second set of temperatures, wherein each temperature in the first set corresponds to the temperature at a first different respective regions of a substrate and wherein each temperature in the second set corresponds to a second different one of the respective regions of the substrate;

a patterning system to form a first and a second pattern of alignment features at the first different respective regions of the substrate having the measured first set of temperatures during an exposure of the substrate and at the second different respective regions of the substrate having the measured second set of temperatures during a subsequent exposure of the substrate;

a metrology system to measure a first and a second set of spatial distributions of the first and the second pattern of alignment features of the substrate occurring during a measurement of the first and the second set of temperatures; and a calculating system to calculate a dimensional response from differences between measurements of the first set of spatial distributions and measurements of the second set of spatial distributions.

17. The lithographic apparatus of claim 16, wherein the substrate is a reference substrate which is one of a class of substrates having similar physical characteristics and which are to be processed in a lithographic apparatus, wherein the spatial distribution of the alignment features of the reference substrate is measured when the reference substrate is supported on a substrate support of the lithographic apparatus, wherein a member of the class of substrates is subsequently placed on the substrate support, wherein the temperature of the substrate supported on the substrate support is measured at each of a plurality of regions distributed across a substrate surface, and wherein the substrate is processed based on a correlation of a change in the substrate dimensions and a dimensional response model derived from the reference substrate.

18. The lithography system of claim 16, wherein the first and second patterns have a same nominal spatial distribution with a nominal offset between the two patterns and the dimensional response model is derived from differences between nominal and measured offsets between features of the two patterns.

* * * * *